(12) United States Patent
Kim et al.

(10) Patent No.: US 11,854,774 B2
(45) Date of Patent: Dec. 26, 2023

(54) PLASMA DETECTING DEVICE

(71) Applicant: PSK Holdings Inc., Hwaseong-si (KR)

(72) Inventors: Nam Young Kim, Hwaseong-si (KR); Hyeong Mo Yoo, Pyeongtaek-si (KR)

(73) Assignee: PSK Holdings Inc., Hwaseong-si (KR)

( * ) Notice: Subject to any disclaimer, the term of this patent is extended or adjusted under 35 U.S.C. 154(b) by 269 days.

(21) Appl. No.: 17/404,984

(22) Filed: Aug. 17, 2021

(65) Prior Publication Data

US 2022/0301836 A1    Sep. 22, 2022

(30) Foreign Application Priority Data

Mar. 17, 2021 (KR) .......................... 10-2021-0034686

(51) Int. Cl.
*H01J 37/32* (2006.01)
*H01L 21/66* (2006.01)

(52) U.S. Cl.
CPC ........ *H01J 37/32963* (2013.01); *H01L 22/12* (2013.01); *H01L 22/26* (2013.01)

(58) Field of Classification Search
CPC ..... H01J 37/32963; H01L 22/12; H01L 22/26
USPC .......................................... 356/432
See application file for complete search history.

(56) References Cited

U.S. PATENT DOCUMENTS

| | | | |
|---|---|---|---|
| 6,455,437 B1 | 9/2002 | Davidow et al. | |
| 2008/0074380 A1* | 3/2008 | Owyeung | H04N 23/74 345/102 |
| 2008/0236486 A1 | 10/2008 | Lin | |
| 2016/0293390 A1 | 10/2016 | Miura et al. | |
| 2016/0365227 A1 | 12/2016 | Suemitsu | |
| 2019/0318915 A1 | 10/2019 | Nagami et al. | |
| 2019/0355559 A1* | 11/2019 | Yun | G01J 3/443 |
| 2021/0074516 A1 | 3/2021 | Ikeda et al. | |
| 2021/0225674 A1 | 7/2021 | Eto et al. | |

FOREIGN PATENT DOCUMENTS

| | | | | |
|---|---|---|---|---|
| CN | 101611340 B | * | 8/2011 | ......... G02F 1/13318 |
| CN | 103258706 A | | 8/2013 | |
| CN | 104135812 A | * | 11/2014 | |
| JP | 2003068714 A | * | 3/2003 | |
| JP | 2005-048249 A | | 2/2005 | |
| JP | 2011-086601 A | | 4/2011 | |
| JP | 2016-505863 A | | 2/2016 | |
| KR | 20-1998-0067037 U | | 12/1998 | |
| KR | 10-2003-0072031 A | | 9/2003 | |
| KR | 10-2007-0035346 A | | 3/2007 | |
| KR | 10-2007-0069856 A | | 7/2007 | |
| KR | 20090005719 A | * | 1/2009 | |
| KR | 10-2010-0048521 A | | 5/2010 | |
| KR | 10-1036211 B1 | | 5/2011 | |
| KR | 10-1362730 B1 | | 2/2014 | |
| KR | 10-1466127 B1 | | 11/2014 | |
| KR | 10-2015-0015600 A | | 2/2015 | |
| KR | 10-2016-0058490 A | | 5/2016 | |

(Continued)

*Primary Examiner* — Michael A Lyons
*Assistant Examiner* — Omar H Nixon
(74) *Attorney, Agent, or Firm* — Park, Kim & Suh, LLC

(57) ABSTRACT

Disclosed is a detection device which includes a measurement unit including an illumination sensor that measures an amount of light in an interior of a chamber, and a detection unit that detects whether plasma is generated in the interior of the chamber, through analysis of the amount of the light.

14 Claims, 4 Drawing Sheets

(56) References Cited

FOREIGN PATENT DOCUMENTS

| KR | 10-1764844 B1 | 8/2017 |
| KR | 10-2020-0110955 A | 9/2020 |
| KR | 10-2170403 B1 | 10/2020 |
| KR | 10-2200152 B1 | 1/2021 |
| TW | 501216 B | 9/2002 |
| TW | 556340 B | 11/2016 |

* cited by examiner

PLASMA DETECTING DEVICE

CROSS-REFERENCE TO RELATED APPLICATIONS

A claim for priority under 35 U.S.C. § 119 is made to Korean Patent Application No. 10-2021-0034686 filed on Mar. 17, 2021, in the Korean Intellectual Property Office, the entire contents of which are hereby incorporated by reference.

BACKGROUND

Embodiments of the inventive concept described herein relate to a device for detecting whether plasma is generated in a chamber.

Most of semiconductor manufacturing facilities that treat etching processes analyze wavelengths of light emitted from plasma by applying an end point detector (EPD) using an optical emission spectroscopy (OES) technology and identifies whether a desired film is removed through this.

However, in a descum facility that is directed not to removing a film of a photosensitive liquid as in a full strip facility but to removing scums left in a wafer, the EPD may be used only for a purpose of simply identifying whether plasma is generated. In other words, in the descum facility, the EPD shows a very low efficiency as compared with the price of the product due to a low utility.

For the reason, most of the descum facilities do not have an EPD. However, a facility that does not identify whether plasma is generated receives an input signal for a RF bias on signal from a generator and an FF on status is displayed on a display menu, but actually, it is difficult to immediately identify a situation, in which plasma is not discharged in an interior of a chamber, when the situation occurs.

Korean Patent No. 1764844 discloses a technology of precisely detecting an etching ending point by allowing a plurality of filters to transmit light of a specific wavelength.

SUMMARY

Embodiments of the inventive concept provide a detection device that may identify whether plasma is generated by detecting an amount of light generated in an interior of a chamber.

The technical problems that are to be solved by the inventive concept are not limited to the above-mentioned ones, and the other technical problems that have not been mentioned will be clearly understood from the following description by an ordinary person in the art, to which the inventive concept pertains.

According to an exemplary embodiment, a detection device includes a measurement unit including an illumination sensor that measures an amount of light in an interior of a chamber, and a detection unit detects whether plasma is generated in the interior of the chamber, through analysis of the amount of the light.

A bracket may be installed in a view port of the chamber and has an opening on one surface thereof, which faces the view port, and a cover covers the opening of the bracket, the measurement unit may be formed to be attached to or detached from one side of the opening, the cover may have a plate shape such that a center portion of the cover faces the opening, and an edge portion of the cover faces the bracket, a suction unit that may suction the edge portion of the cover is provided on one surface of the bracket, which faces the edge portion of the cover, the cover may be attached to or detached from an opposite side of the opening by the suction unit, and the view port may be optically shielded from an outer side when the measurement unit is mounted on the one side of the opening and the cover is mounted on the opposite side of the opening.

The one side of the opening may be closed by the measurement unit mounted on the bracket, the opened opposite side of the opening may have a rectangular shape, and magnets that suctions the cover may be installed at portions of the bracket, which face corners of the rectangular shape.

A bracket may be installed in a view port of the chamber and has an opening on one surface thereof, which faces the view port, the bracket may be formed to be mounted on an end point detector (EPD) that covers the entire opening, the measurement unit may cover only one side of the opening in a state, in which the EPD is excluded, and a cover may cover the remaining portion of the opening, which is left after the opening is covered by the measurement unit.

The illumination sensor may receive light emitted from plasma generated in the interior of the chamber, through a view port of the chamber, the illumination sensor may include an ambient light sensor of a current output type, and the measurement unit may include an amplifier and a comparator that converts an output value of the ambient light sensor to an analog voltage value, and a comparator.

An adjustment unit may adjust a detection point for detecting whether the plasma is generated, and the detection unit may detect whether the plasma is generated by comparing a preset voltage value adjusted by the adjustment unit and a measured voltage value that represents the amount of the light measured by the measurement unit.

The measurement unit may output a measured voltage value that represents the amount of the light, the detection unit may determine that the plasma is generated when the measured voltage value is a preset detection point or more, and the detection unit may set the specific voltage value measured by the measurement unit as the detection point in a state in which it is determined that the plasma is generated in an interior of the chamber provided in a field during initial setting.

The illumination sensor may convert all of output voltage values each corresponding to a light amount value of a preset light amount value or more to a preset voltage value, and the preset light amount value may be set to be higher than a light amount value corresponding to a detection point that is a reference for detecting whether the plasma is generated.

The illumination sensor may linearly represent the plasma, in a sequence of the darkest plasma to the brightest plasma, which are generated in the chamber in a field, within a voltage value in a preset range.

The detection device may further include a selector, an amplifier, an adjustor, and a converter, wherein the selector selects a plasma process condition in a field, the amplifier may amplify an output value of the illumination sensor depending on an amplification ratio corresponding to the process condition selected by the selector, the adjustor may adjust a gain of the amplified output value, and the converter may convert a value output by the adjustor to a voltage value that satisfies a preset range.

The detection device may further include a first amplifier having an amplification ratio of 10 times, a second amplifier having an amplification ratio of 40 times, a third amplifier of an amplification ratio of 500 times, and a selector, and the selector may connect an output terminal of the illumination sensor to the first amplifier in a radio frequency (RF) process, may connect the output terminal of the illumination sensor to the second amplifier in a micro wave (MW) process that uses oxygen, and may connect the output terminal of the illumination sensor to the third amplifier in a micro wave (MW) process that uses hydrogen or nitrogen.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
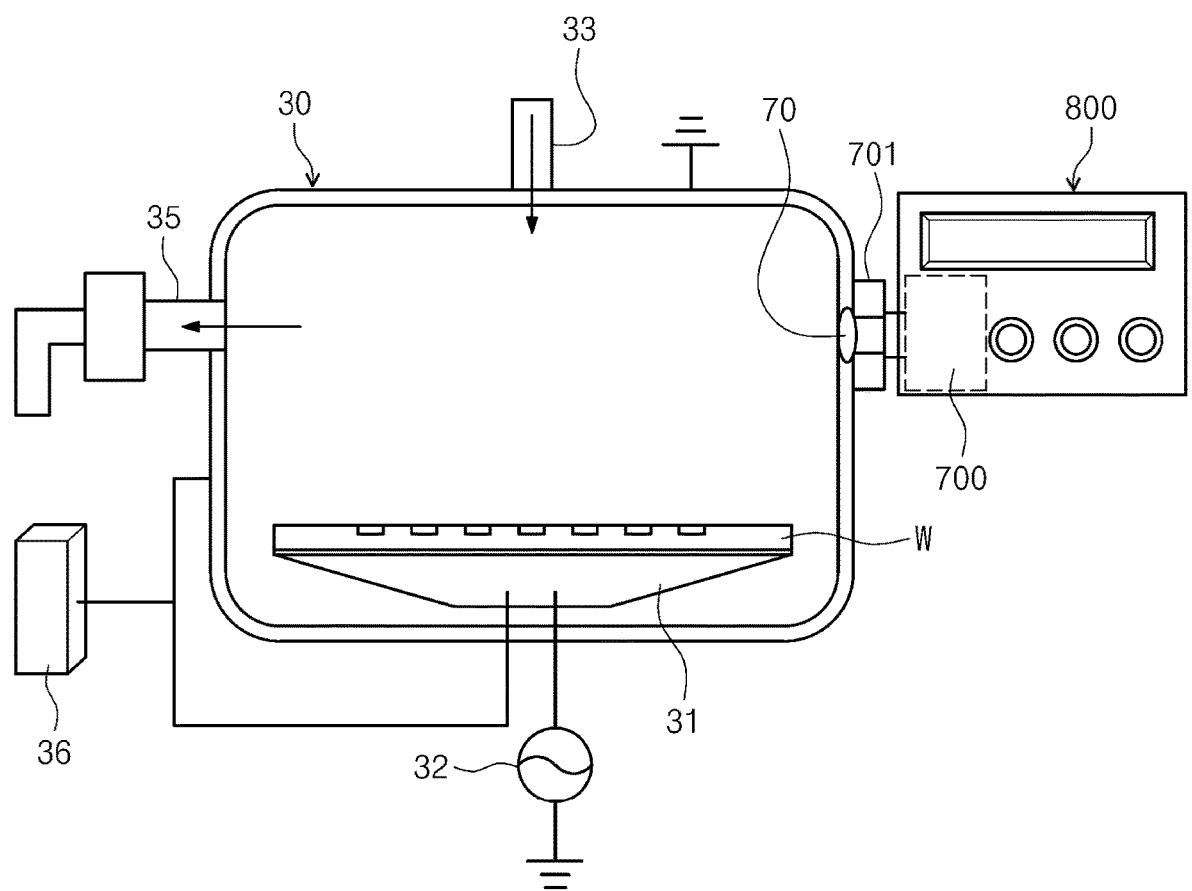
FIG. 1 is a schematic view illustrating a detection device of the inventive concept.

The above and other advantages and features of the inventive concept, and methods of the inventive concept for achieving them will become apparent from the following description of the following embodiments which are given in conjunction with the accompanying drawings and will be described below in detail. However, the inventive concept is not limited by the embodiments disclosed herein but will be realized in various different forms, and the embodiments are provided only to make the disclosure of the inventive concept complete and fully inform the scope of the inventive concept to an ordinary person in the art, to which the inventive concept pertains, and the inventive concept will be defined by the scope of the claims.

Although not defined, all the terms (including technical or scientific terms) used herein may have the same meanings that are generally accepted by the common technologies in the field to which the present invention pertains.

The terms defined by the general dictionaries may be construed to have the same meanings as those meant in the related technologies and/or the disclosure of the application, and will neither become conceptual nor be construed to be excessively formal even though not clearly defined herein.

The terms used herein are provided to describe the embodiments but not to limit the inventive concept. In the specification, the singular forms include plural forms unless particularly mentioned.

The expressions 'include' and/or its various conjugated forms, such as 'including', which are used in the specification do not exclude existence or addition of one or more compositions, substances, elements, steps, operations, and/or devices. In the specification, the term 'and/or' represents enumerated configurations or various combinations thereof.

Meanwhile, the terms 'part', '~er(or)', 'block', 'module', and the like used in the specification may mean a unit for processing at least one function or operation. For example, they may mean software, and hardware elements such as an FPGA or an ASIC.

However, the 'part', '~er(or), 'block', 'module', and the like are not limited to software or hardware. The 'part', '~er(or)', 'block', and 'module' may be constituted in a storage medium that may perform addressing, and may be configured to reproduce one or more processors.

Accordingly, as an example, the 'part', '~(or)', 'block', and 'module' include elements such as software elements, object-oriented software elements, class elements, and task elements, processes, functions, attributes, procedures, subroutines, segments of a program code, drivers, firmware, micro-codes, circuits, data, a database, data structures, tables, arrays, and parameters.

The elements and the functions provided in the 'part', '~er(or)', 'block', and "module" may be coupled to a smaller number of elements and the 'unit', '~er(or)', 'block', and 'module' or may be separated to additional elements and 'units', '~ers(ors)', and 'blocks', 'modules'.

Hereinafter, exemplary embodiments of the inventive concept will be described in detail with reference to the accompanying drawings of the specification.

FIG. 1 is a schematic view illustrating a detection device of the inventive concept.

The detection device illustrated in FIG. 1 may include a measurement unit 700 and a detection unit 800.

The measurement unit 700 may include an illumination sensor 770 that measures an amount of light in an interior of a chamber 30.

The chamber 30 may have a vessel shape, in which a space for receiving a wafer "W" is received.

A stage 31 or a chuck, to which the semiconductor wafer "W" is fixed, may be provided in the interior of the chamber 30. When the wafer "W" is fixed to the stage 31, a fuel gas or a reaction gas may be injected into the chamber 30 through a gas injecting part 33. Thereafter, an electric voltage may be applied to the interior of the chamber 30 by a radio frequency (RF) power source 32 or a micro wave (MW) power source 32. Furthermore, an electromagnetic field generated by the electric power may be formed in the interior of the chamber 30. The reaction gas injected into the interior of the chamber 30 may be changed into a plasma state by the electric voltage applied to the interior of the chamber 30 or the electromagnetic field formed in the interior of the chamber 30, and a plasma process on the semiconductor wafer "W" may be performed. The plasma process may include a deposition process, an etching process, and a washing process.

When the plasma process is ended, a temperature controller 36 of the chamber 30 may lower a temperature in the interior of the chamber 30. An exhaustion device 35 may prepare for the next plasma process by discharging the reaction gas in the interior of the chamber 30 to an outside through a vacuum pump.

The measurement unit 700 may collect light generated from plasma through a view port 70 provided on a side wall of the chamber 30 while the plasma process is performed. The collected light may be used to detect whether plasma is present or generated in the process after being delivered to the illumination sensor 770 and the detection unit 800.

The view port 70 may have a shape, in which an opening formed on a side surface of the chamber 30 is closed by a preset number of transparent heat-resistant/pressure-resistant glass windows of an excellent light transmitting property. The transparent heat-resistant/pressure-resistant glass windows and the chamber 30 may be sealed by a sealing member, such as heat-resistant silicon or the like.

A connector 701 connected to the measurement unit 700 may be provided on an outer surface of the chamber 30. The connector 701 may include a bracket 703 and a cover 705.

The bracket 703 may be installed on the outer surface of the chamber 30, and the cover 705 may be configured to cover a vent hole or the opening 704 formed at a center of the bracket 703.

Figure 2:
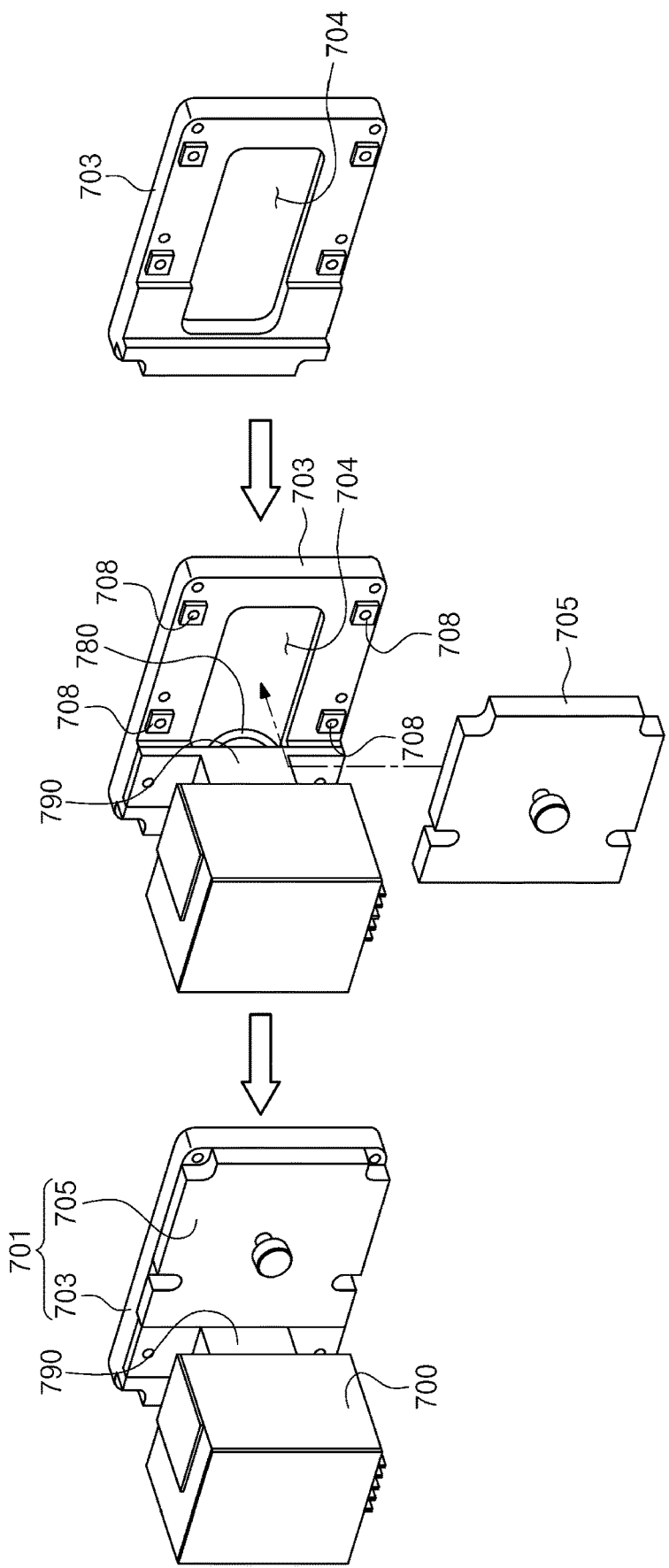
FIG. 2 is a schematic view illustrating a bracket and a cover.

FIG. 2 is a schematic view illustrating the bracket 703 and the cover 705.

The bracket 703 may be installed in the view port 70 of the chamber 30, and the opening 704 corresponding to the vent hole may be formed on one surface of the bracket 703, which faces the view port 70. The bracket 703 may have a rectangular ring or donut shape having a vent hole at a center thereof.

The measurement unit 700 may be formed to be attached to or detached from one side of the opening 704 formed in the bracket 703.

For example, a screw hole, into which a screw that connects the measurement unit 700 and the bracket 703 is inserted, may be formed on one surface of the bracket 703, which faces the measurement unit 700. The measurement unit 700 may be mounted on or separated from the bracket 703 through coupling and separation of the coupling screw that passes through the screw hole.

The measurement unit 700 may be provided with an attachment unit 790 that is attached to or detached from the bracket 703, and a body tube 780 formed on one surface of the attachment unit 790, which faces the opening 704 of the bracket 703. The body tube 780 may include a lens that collects light in the interior of the chamber 30 and delivers the light to the illumination sensor 770, and the like. A through-hole, through which a screw passes, may be provided on one surface of the attachment unit 790, which faces the bracket 703. The through-hole may be aligned with a screw hole formed in the bracket 703. When the screw that passed through the through-hole is fastened with the screw hole, the attachment unit 790 may be mounted on the bracket 703.

An area of the one surface of the measurement unit 700, which faces the opening 704 of the bracket 703, may be smaller than that of the opening 704. As a result, even though the measurement unit 700 is mounted on one side of the opening 704, an opposite side of the opening 704 may maintain a state, in which the opening 704 is opened to the outside. When the opposite side of the opening 704 is opened, light outside the chamber 30 may be introduced into the measurement unit 700 through the opposite side of the opening 704. Because the light introduced from the outside corresponds to noise, it is preferable that the opposite side of the opening 704 is closed to reduce the noise.

The cover 705 may be used to cover the remaining portion, except for a portion of the one side of the opening 704, which is covered by the measurement unit 700.

The cover 705 may have a plate shape, a central portion of which faces the opening 704 of the bracket 703 and an edge portion of which faces the bracket 703.

A suction unit 708 that suctions the edge portion of the cover 705 may be provided on one surface of the bracket 703, which faces an edge of the cover 705.

The cover 705 may be attached to or detached from the opposite side of the opening 704 by the suction unit 708.

When the measurement unit 700 is mounted on the one side of the opening 704 and the cover is mounted on the opposite side of the opening 704, the view port 70 may be optically shielded from the outside. In other words, the entire opening 704 may be closed from the outside due to the one surface of the measurement unit 700, which faces the opening 704, and the cover 705.

When the suction unit 708 is used in a state, in which a separate coupling screw and the like are excluded, a user may easily attach and detach the cover 705 to and from the opposite side of the opening. The user may open the cover 705 and directly identify the interior of the chamber 30 by naked eyes. Furthermore, the user may increase a measurement precision of the measurement unit 700 by covering the cover 705.

The one side of the opening 704 may be closed by the measurement unit 700 mounted on the bracket 703.

The opposite side of the opened opening 704 may have a rectangular shape. Magnets that suction the cover 705 may be installed at portions of the bracket 703, which face the corners of the rectangular shape. When differently explained, the magnets may be installed at points, which face ends of a diagonal line on the opposite side of the opened opening 704. The cover 705 may have a rectangular plate shape. According to the present embodiment, because all of the corners of the cover 705 face the magnets installed in the bracket 703, the cover 705 may be mounted on the bracket 703 more certainly by magnetic forces. Of course, magnetic bodies that react with the magnetic forces may be provided at the corners of the cover 705, which faces the magnets, or the cover 705 itself may be formed of a magnetic material.

The bracket 703 installed in the view port 70 of the chamber 30 and having the opening 704 on the one surface thereof, which faces the view port 70, may be formed to be mounted on an end point detector (EPD) that covers the entire opening 704. Then, the measurement unit 700 may cover only the one side of the opening 704 in a state, in which the EPD is excluded. The remaining portion of the opening 704, which is left after the opening 704 is covered by the measurement unit 700, may be covered by the cover 705. According to the present embodiment, the bracket 703 may be commonly used for the EPD and the measurement unit 700.

The EPD may determine an ending point of the plasma process, that is, the etching process by receiving the light due to the plasma generated during the plasma process and calculating a change of a unique wavelength of the material. Although it may be recognized whether plasma is present or generated when the EPD is used, there is a limit functionally or in an aspect of price in being used only for recognizing whether plasma is generated. Accordingly, it may be advantageous to classify the chamber 30, to which the EPD is to be applied, and the chamber 30, to which the measurement unit 700 of the inventive concept is applied, when using them. Then, according to the present embodiment, in which the separate cover 705 is used, the bracket 703 of the same standard may be installed in the chamber 30 regardless of the kind of the chamber 30. When the specific chamber 30 requires the EPD, the EPD may be mounted on the corresponding bracket 703. When the specific chamber 30 requires the measurement unit 700, the measurement unit 700 may be mounted on the one side of the corresponding bracket 703 and the cover 705 may be mounted on the opposite side of the corresponding bracket 703.

The illumination sensor 770 may receive the light emitting from the plasma generated in the interior of the chamber 30 through the view port 70 of the chamber 30.

As compared with light caused by sparks intermittently generated in the interior of the chamber 30 in a state in which the plasma is excited or a state in which the plasma is generated, an amount of the light caused by the plasma itself generated in the interior of the chamber 30 is very small.

The illumination sensor 770 that receives the small amount of the light via the view port 70 corresponding to an obstacle may include an ambient light sensor of a current output type, which is distinguished from a general light sensor that detects sparks generated in the interior of the chamber 30.

The ambient light sensor of a current output type may be robust to surrounding noise, and may detect the amount of the fine light.

The measurement unit 700 may be provided with an amplifier 720 and a comparator that convert an output value of the ambient light sensor of a current output type to an analog voltage value. Even though the fine light in the chamber 30 is detected by the ambient light sensor of a current output type, the corresponding detection result may be smaller than an amount of light that is necessary for detecting whether plasma is generated or a voltage value corresponding thereto. The amplifier 720 or a comparator may be used to convert the detection result to a scale for detecting whether plasma is generated.

The amplifier 720 may amplify the detection result value of the ambient light sensor to a preset amplification ratio. The comparator may classify the detection result value into high and low. A main purpose of the detection device of the inventive concept is not to recognize an intensity of plasma in the interior of the chamber 30 but to detect whether plasma is present in the chamber 30 or not. Accordingly, the purpose of the inventive concept may be sufficiently achieved as long as a signal that represents that plasma is present in the chamber 30, for example, a high signal, and a signal that represents that plasma is not present in the chamber 30, for example, a low signal may be classified certainly. Accordingly, the detection device of the inventive concept may be sufficiently operated even through the comparator.

Furthermore, the comparator may be used for comparing a measurement value of the illumination sensor 770 and a preset detection point.

An adjustment unit may be configured to adjust a detection point for detecting whether plasma is generated. As an example, the adjustment unit may include a variable resistor. The detection unit 800 may detect whether plasma is generated by comparing a preset voltage value adjusted by the adjustment unit and a measured voltage value that represents an amount of light measured by the measurement unit 700. In order to normally operate the adjustment unit, a process of setting a preset voltage value in an initial stage may be important.

The adjustment unit may directly set the detection point in the field. As an example, the measurement unit 700 may output a measured voltage value that represents the amount of light. The detection unit 800 may detect that the plasma is generated when the measured voltage value is a preset detection point or more.

During initial setting, the detection unit 800 may set the specific voltage value measured by the measurement unit 700 as the detection point in a state, in which it is identified that the plasma is generated in the interior of the chamber 30 provided in the field. As an example, during the initial setting, the user may identify whether the plasma is generated in the interior of the chamber 30 by naked eyes through the view port 70 in s state, in which the measurement unit 700 is installed in the bracket 703 and the cover 705 is opened. When the user presses a setting button after identifying that the plasma is generated, by naked eyes, and closing the cover 705, the detection unit 800 may set the specific voltage value measured by the measurement unit 700 as the detection point. As another example, after various environment information of the chamber 30, for example, a power value supplied to an antenna that generates the plasma, the kind of the reaction gas introduced into the chamber 30, and the like are compared with a lookup table, a specific voltage value matched with the lookup table may be set as the detection point.

The detection points may be different according to the work fields. Accordingly, for the same detection device, the amounts of lights, by which it is detected that plasma is generated, may be different.

Figure 3:
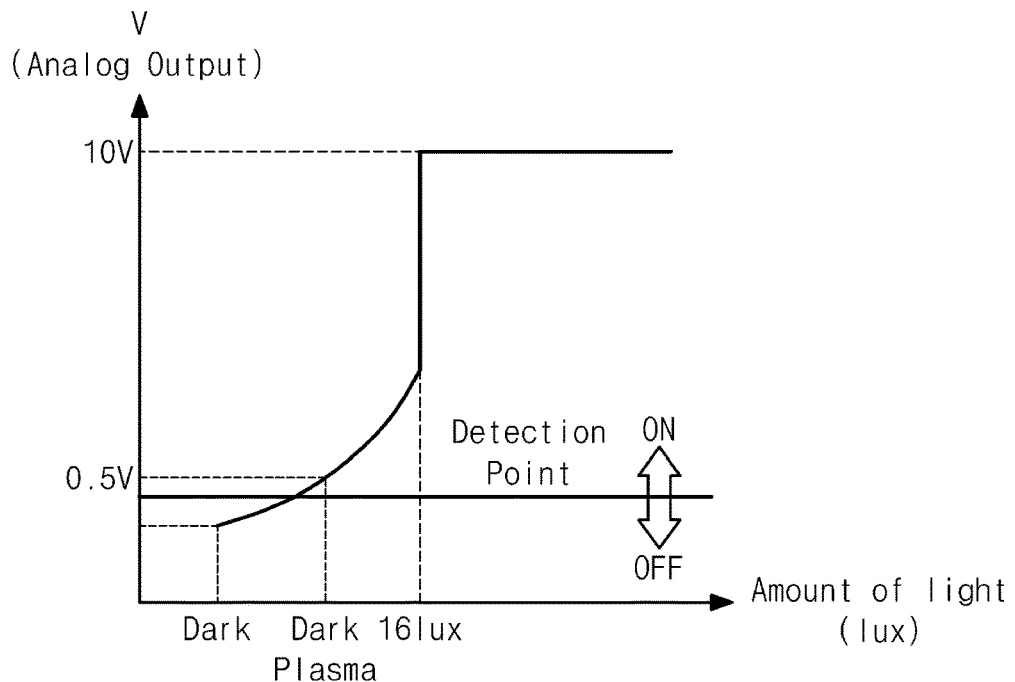
FIG. 3 and FIG. 4 are graphs depicting relationships between light amount values and voltage values.
Figure 4:
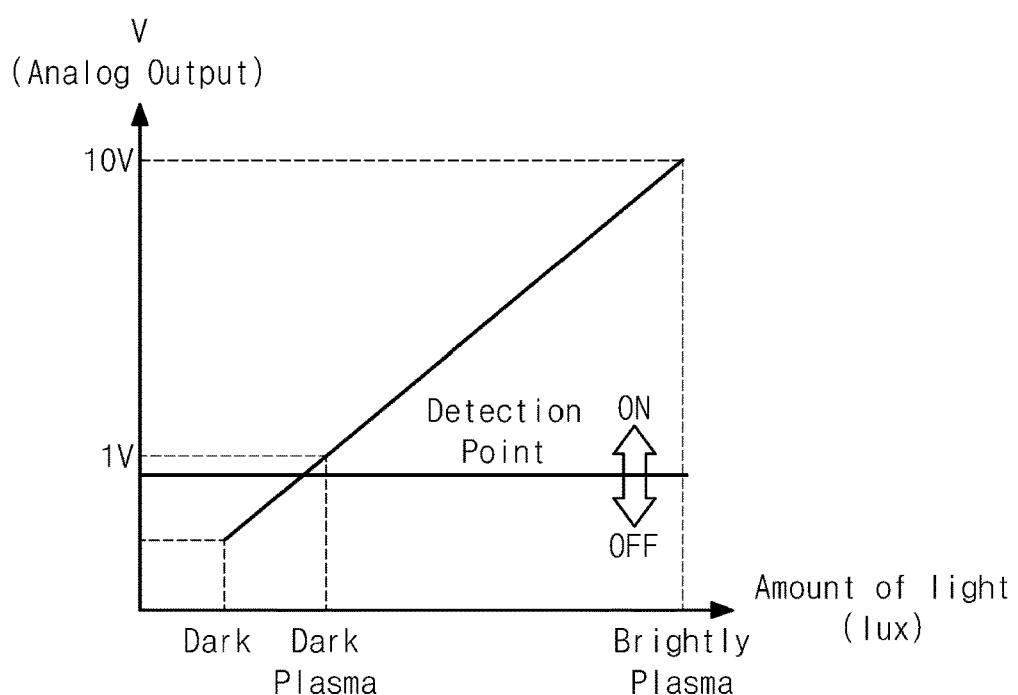

FIG. 3 and FIG. 4 are graphs depicting relationships between light amount values and voltage values.

FIG. 3 may illustrate a configuration for digitalizing whether plasma is generated in the chamber 30.

The illumination sensor 770 or the measurement unit 700 may convert all of output voltage values corresponding to an amount of light of a preset light amount or more as preset voltage values.

The preset light amount value may be set to be higher than the light amount value corresponding to the detection point that is a reference for detecting whether the plasma is generated.

Referring to FIG. 3, the illumination sensor 770 may detect an amount of light ranging from 0 lux to 1.6 lux. The illumination sensor 770 or the measurement unit 700 may be designed to convert all output values corresponding to an amount of light of 16 lux or more to 10 V. In this case, an on/off state of the plasma in the chamber 30 may be digitalized and represented for a voltage value obtained with reference to a detection point of 0.5 V. The on state of the plasma may represent a state, in which the plasma is present or generated, and the off state of the plasma may represent a state, in which plasma is neither present nor generated. In other words, the off state of the plasma may represent a state, in which the plasma is not present.

FIG. 4 may illustrate a configuration for linearly representing whether plasma is generated in the chamber 30.

The illumination sensor 770 or the measurement unit 700 may linearly represent plasma, in a sequence from the darkest plasma to the brightest plasma, generated in the chamber 30 in the field in voltage values in a preset range.

Referring to FIG. 4, the darkest plasma may represent the same measured voltage value as the detection point. In FIG. 4, the illumination sensor 770 that may linearly measure the amount of light in a range of the detection point up to 10 times of the detection point when the detection point is 1 V. According to the present embodiment, the illumination sensor 770 or the measurement unit 700 may represent the amount of light of the plasma in the chamber 30 in an analog output. The detection unit 800 may monitor the amount of the light of the plasma in the chamber in real time.

The detection device of the inventive concept may detect the safety of the plasma process through output of an analog voltage as in FIG. 4.

As an example, recipes may be different for customer A, customer B, and customer C.

An amount of light desired by customer A may be 3 V. The detection device may determine that data for the plasma process is effective when the amount of light for customer A is within an error range of 0.5 V with reference to 3V (2.5 V<the voltage value corresponding to the measured light amount<3.5 V). Then, the voltage value of 2.5 V<the voltage value corresponding to the measured light amount<3.5 V may be set as a voltage value in a suitable range for customer A. When the voltage value deviates from the corresponding error range, the detection device may inform that the current plasma state is unstable through an equipment interlock.

Figure 5:
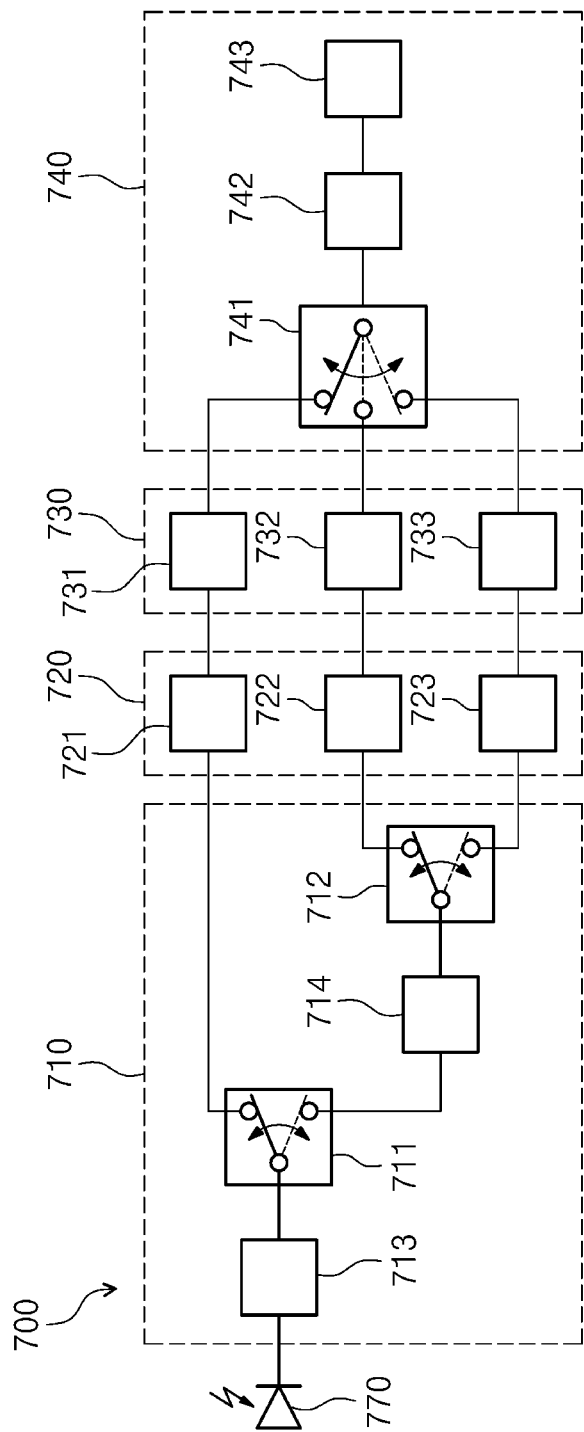
FIG. 5 is a schematic view illustrating a measurement unit.

FIG. 5 is a schematic view illustrating a measurement unit.

Referring to FIG. 5, as described above, the measurement unit 700 of the inventive concept needs to measure an amount of the light caused from the plasma itself having a very small amount of light as compared with sparks. Because the voltage value corresponding to the measurement result also is physically very small, it may not reach a value required by the detection unit 800. It is necessary to significantly convert the measured result value to decrease a probability of intervening of noise in the fine measurement result. To achieve this, the measurement unit 700 may be additionally provided with a selector 710, the amplifier 720, an adjustor 730, and a converter 740.

The selector 710 may select a plasma process condition in the field. As an example, the selector 710 may be provided with a first converter 713, a first switch 711, a second converter 714, and a second switch 712.

The plasma process condition may include a radio frequency (RF) process condition (a first condition), a micro wave (MW) process condition (a second condition) that uses oxygen, and a micro wave process condition (a third condition) that uses hydrogen or nitrogen.

The first switch 711 may switch selection of the MW process condition (the third condition) that uses hydrogen or nitrogen.

The second switch 712 may switch the radio frequency (RF) process condition (the first condition) and the micro wave (MW) process condition (the second condition) that uses oxygen in a state, in which the third condition is not selected.

The first converter 713 may include a first determination unit that analyzes data received from a switch manipulated by the user or a control system of the chamber 30 and determines whether the third condition is satisfied. The first converter 713 may control a switching operation of the first switch 711 according to a manual manipulation by the user or whether the third condition is satisfied.

Furthermore, the first converter 713 may convert output information of the illumination sensor 770 to a format required by an input terminal of the first switch 711.

The second converter 714 may include a second determination unit that analyzes data received from a switch manipulated by the user or a control system of the chamber and determines whether the first condition or the second condition is satisfied. The second converter 714 may control a switching operation of the second switch 712 according to a manual manipulation by the user or whether the first/second condition is satisfied.

Furthermore, the second converter 714 may convert output information output from an output terminal of the first switch 711 to a format required by an input terminal of the second switch 712.

The amplifier 720 may amplify the output value of the illumination sensor 770 according to an amplification ratio corresponding to a process condition selected by the selector 710.

As an example, the amplifier 720 may be provided with a first amplifier 721 having an amplification ratio of 10 times, a second amplifier 722 having an amplification ratio of 40 times, and a third amplifier 723 having an amplification ratio of 500 times.

The selector 710 may connect an output terminal of the illumination sensor 770 to the first amplifier 721 in the radio frequency (RF) process (the first condition).

The selector 710 may connect the output terminal of the illumination sensor 770 to the second amplifier 722 in the micro wave (MW) process that uses oxygen (the second condition).

The selector 710 may connect the output terminal of the illumination sensor 770 to the third amplifier 723 in the micro wave (MW) process that uses hydrogen or nitrogen (the third condition).

The adjustor 730 may adjust a gain of the amplified output value. The adjustor 730 may perform so called a field-adaptive turning operation by using a reference measurement value measured through the measurement unit 700, for example, a detection point. A first adjustor 731 that tunes information output from the first amplifier 721, a second adjustor 732 that tunes information output from the second amplifier 722, and a third adjustor 733 that tunes information output from the third amplifier 723 may be provided.

The converter 740 may convert the output value output from the adjustor 730 to a voltage value that satisfies a preset range. The converter 740 may be provided with a third switch 741, a scaling unit 742, and an equalizer 743.

The third switch 741 may be switched in correspondence to an operation of the selector 710.

In the first condition, the third switch 741 may be switched to be connected to an output terminal of the first adjustor 731.

In the second condition, the third switch 741 may be switched to be connected to an output terminal of the second adjustor 732.

In the third condition, the third switch 741 may be switched to be connected to an output terminal of the third adjustor 733.

The scaling unit 742 may convert information output from the third switch 741 to a specific voltage value that satisfies a preset voltage range.

The equalizer 743 may correct characteristics of information output from the scaling unit 742 or remove noise included in information output from the scaling unit.

The detection device of the inventive concept may detect an amount of light generated in an interior of a chamber during a semiconductor process in a descum facility, and may identify whether plasma is generated or present through a light amount detection result.

The detection device of the inventive concept may use an ambient light sensor based on an analog current output to minimize noise of a voltage output value according to an intensity of illumination (lux) caused by plasma. The detection device may efficiently detect plasma in all process recipes of a descum facility through an electric circuit such as an amplifier, a comparator, and the like.

The detection device of the inventive concept may detect plasma by using an illumination sensor instead of a high-priced end point detector (EPD). Accordingly, according to the inventive concept, productivity may be improved.

The detection device of the inventive concept may identify an on/off state that represents whether plasma is present or generated. Furthermore, the detection device may allow a user to identify a process state and recognize a part preventive maintenance (PM) by generating an alarm when a detected voltage deviates from a preset voltage range, and may detect some breakdowns.

The advantageous effects of the inventive concept are not limited to the above-mentioned ones, and the other advantageous effects will be clearly understood by an ordinary person skilled in the art to which the inventive concept pertains.

Although the inventive concept has been described through the embodiments until now, the above embodiments are provided only to describe the spirit of the inventive concept and the inventive concept is not limited thereto. It is noted that those skilled in the art may variously modify the embodiment. The scope of the inventive concept is determined only through the appreciation of the attached claims.

What is claimed is:

1. A detection device comprising:
   a measurement unit including an illumination sensor configured to measure an amount of light in an interior of a chamber; and
   a processor configured to detect whether plasma is generated in the interior of the chamber, through analysis of the amount of the light,
   wherein a bracket is installed in a view port of the chamber and has an opening on one surface thereof, which faces the view port,
   wherein the bracket is formed to be mounted on an end point detector (EPD) that covers the entire opening,
   wherein the measurement unit covers only one side of the opening in a state, in which the EPD is excluded, and
   wherein a cover covers the remaining portion of the opening, which is left after the opening is covered by the measurement unit.

2. The detection device of claim 1, wherein a bracket is installed in a view port of the chamber and has an opening on one surface thereof, which faces the view port, and a cover is configured to cover the opening of the bracket,
   wherein the measurement unit is formed to be attached to or detached from one side of the opening,
   wherein the cover has a plate shape such that a center portion of the cover faces the opening, and an edge portion of the cover faces the bracket,
   wherein a suction unit configured to suction the edge portion of the cover is provided on one surface of the bracket, which faces the edge portion of the cover,
   wherein the cover is attached to or detached from an opposite side of the opening by the suction unit, and
   wherein the view port is optically shielded from an outer side when the measurement unit is mounted on the one side of the opening and the cover is mounted on the opposite side of the opening.

3. The detection device of claim 2, wherein the one side of the opening is closed by the measurement unit mounted on the bracket,
   wherein the opened opposite side of the opening has a rectangular shape, and
   wherein magnets configured to suction the cover are installed at portions of the bracket, which face corners of the rectangular shape.

4. The detection device of claim 1, wherein the illumination sensor receives light emitted from plasma generated in the interior of the chamber, through a view port of the chamber,
   wherein the illumination sensor includes an ambient light sensor of a current output type, and
   wherein the measurement unit includes an amplifier and a comparator configured to convert an output value of the ambient light sensor to an analog voltage value, and a comparator.

5. The detection device of claim 1, wherein an adjustment unit adjusts a detection point for detecting whether the plasma is generated, and
   wherein the processor detects whether the plasma is generated by comparing a preset voltage value adjusted by the adjustment unit and a measured voltage value that represents the amount of the light measured by the measurement unit.

6. The detection device of claim 1, wherein the measurement unit outputs a measured voltage value that represents the amount of the light,
   wherein the processor determines that the plasma is generated when the measured voltage value is a preset detection point or more, and
   wherein the processor sets the specific voltage value measured by the measurement unit as the detection point in a state in which it is determined that the plasma is generated in an interior of the chamber provided in a field during initial setting.

7. The detection device of claim 1, wherein the illumination sensor converts all of output voltage values each corresponding to a light amount value of a preset light amount value or more to a preset voltage value, and
   wherein the preset light amount value is set to be higher than a light amount value corresponding to a detection point that is a reference for detecting whether the plasma is generated.

8. The detection device of claim 1, wherein the illumination sensor linearly represents the plasma, in a sequence of the darkest plasma to the brightest plasma, which are generated in the chamber in a field, within a voltage value in a preset range.

9. The detection device of claim 1, further comprising:
   a selector;
   an amplifier;
   an adjustor; and
   a converter,
   wherein the selector selects a plasma process condition in a field,
   wherein the amplifier amplifies an output value of the illumination sensor depending on an amplification ratio corresponding to the process condition selected by the selector,
   wherein the adjustor adjusts a gain of the amplified output value, and
   wherein the converter converts a value output by the adjustor to a voltage value that satisfies a preset range.

10. The detection device of claim 1, further comprising:
    a first amplifier having an amplification ratio of 10 times;
    a second amplifier having an amplification ratio of 40 times;
    a third amplifier of an amplification ratio of 500 times; and
    a selector,
    wherein the selector is configured to:
       connect an output terminal of the illumination sensor to the first amplifier in a radio frequency (RF) process;
       connect the output terminal of the illumination sensor to the second amplifier in a micro wave (MW) process that uses oxygen; and
       connect the output terminal of the illumination sensor to the third amplifier in a micro wave (MW) process that uses hydrogen or nitrogen.

11. A detection device comprising:
    a measurement unit including an illumination sensor configured to measure an amount of light in an interior of a chamber; and
    a processor configured to detect whether plasma is generated in the interior of the chamber, through analysis of the amount of the light,
    wherein an adjustment unit adjusts a detection point for detecting whether the plasma is generated, and wherein the processor detects whether the plasma is generated by comparing a preset voltage value adjusted by the adjustment unit and a measured voltage value that represents the amount of the light measured by the measurement unit.

12. A detection device comprising:
a measurement unit including an illumination sensor configured to measure an amount of light in an interior of a chamber; and
a processor configured to detect whether plasma is generated in the interior of the chamber, through analysis of the amount of the light,
wherein the measurement unit outputs a measured voltage value that represents the amount of the light,
wherein the processor determines that the plasma is generated when the measured voltage value is a preset detection point or more, and
wherein the processor sets the specific voltage value measured by the measurement unit as the detection point in a state in which it is determined that the plasma is generated in an interior of the chamber provided in a field during initial setting.

13. A detection device comprising:
a measurement unit including an illumination sensor configured to measure an amount of light in an interior of a chamber; and
a processor configured to detect whether plasma is generated in the interior of the chamber, through analysis of the amount of the light,
wherein the illumination sensor converts all of output voltage values each corresponding to a light amount value of a preset light amount value or more to a preset voltage value, and
wherein the preset light amount value is set to be higher than a light amount value corresponding to a detection point that is a reference for detecting whether the plasma is generated.

14. A detection device comprising:
a measurement unit including an illumination sensor configured to measure an amount of light in an interior of a chamber;
a processor configured to detect whether plasma is generated in the interior of the chamber, through analysis of the amount of the light;
a selector;
an amplifier;
an adjustor; and
a converter,
wherein the selector selects a plasma process condition in a field,
wherein the amplifier amplifies an output value of the illumination sensor depending on an amplification ratio corresponding to the process condition selected by the selector,
wherein the adjustor adjusts a gain of the amplified output value, and
wherein the converter converts a value output by the adjustor to a voltage value that satisfies a preset range.

* * * * *